United States Patent [19]

Nagasaka et al.

[11] Patent Number: 5,439,732
[45] Date of Patent: Aug. 8, 1995

[54] CERAMIC MULTI-LAYER WIRING BOARD

[75] Inventors: Takashi Nagasaka, Anjo; Yuji Ontani, Okazaki; Mitsuhiro Saitou, Oobu, all of Japan

[73] Assignee: Nippondenso Co., Ltd., Kariya, Japan

[21] Appl. No.: 184,104

[22] Filed: Jan. 21, 1994

[30] Foreign Application Priority Data

Jan. 22, 1993 [JP] Japan ............................. 5-009175

[51] Int. Cl.6 .............................................. B32B 9/00
[52] U.S. Cl. .................................. 428/210; 428/209; 428/432; 428/617; 428/618; 428/673; 428/901
[58] Field of Search ....................... 428/210, 209, 901

[56] References Cited

U.S. PATENT DOCUMENTS 4,795,670  1/1989  Nishigaki et al. ................. 428/209

FOREIGN PATENT DOCUMENTS 61-65464  4/1986  Japan .
61-65465  4/1986  Japan .
3078798  12/1991  Japan .
4-32297  2/1992  Japan .

*Primary Examiner*—Patrick J. Ryan
*Assistant Examiner*—Kam F. Lee
*Attorney, Agent, or Firm*—Cushman, Darby & Cushman

[57] ABSTRACT

In a ceramic multi-layer wiring board, a surface conductor layer is made of a copper-based material and an inner conductor in the ceramic multilayer is a non-copper metal having a melting point higher than a temperature at which the ceramic multilayer is fired, typically Ag. Cu and Ag form eutectic crystals when firing the surface conductor layer of Cu. This can be prevented by connecting the surface conductor layer and the inner conductor with Ag-Pd or a metal which is different from the materials of the surface wiring layer and the inner conductor and which does not form eutectic crystals with the material of the surface wiring layer at the temperature at which the surface wiring layer is fired.

12 Claims, 2 Drawing Sheets

CERAMIC MULTI-LAYER WIRING BOARD

BACKGROUND OF THE INVENTION

1. Field of the Invention

The present invention relates to a ceramic multilayer wiring board.

2. Description of Related Art

Japanese Examined Patent Publication (Kokoku) No. Hei-03-78798 discloses a ceramic multi-layer wiring board in which a copper-based material excellent in resistance to migration is used as a surface wiring conductor and a silver-based material resistant to a high firing temperature in an oxygen atmosphere is used as an inner wiring conductor and through-hole conductor. The Kokokyu also discloses covering the surface of a top through-hole conductor with an eutectic-preventing layer before disposing the surface wiring conductor. The eutectic crystal-preventing layer is provided, by CVD or other means, in order to prevent the formation of Ag-Cu eutectic crystals at the interface between the through-hole conductors and the surface wiring conductor.

This method of preventing eutectic crystals necessitates an additional step of forming the eutectic crystal-preventing layer. If the eutectic crystal-preventing layer is formed by CVD, a long time is required to obtain a necessary thickness of the layer. If the layer is formed by a printing method, a firing step is required and a long time is necessary. If the eutectic crystal-preventing layer is thin, silver or copper diffuses through the eutectic crystal-preventing layer and a Ag-Cu eutectic crystal layer is formed.

Japanese Unexamined Patent Publication (Kokai) No. Hei-04-32297 discloses a second surface wiring conductor disposed between the copper surface wiring conductor and the top through-hole conductor, in order to prevent the formation of the Ag-Cu eutectic crystals. The second surface wiring conductor comprises copper and is fired at a temperature (600° C.) lower than the eutectic temperature of 780° C.

The disposition of the low temperature firing copper surface conductor requires an additional step. The copper surface conductor fired at a low temperature has a low adhesion with the substrate and has a poor wettability with a solder. Thus, the reliability is low.

The object of the present invention is to provide a ceramic multi-layer wiring board comprising a copper-based surface conductor excellent in resistance to migration and a non-copper-based inner wiring layer capable of being fired in an oxidizing atmosphere, by which formation of eutectic crystals between the above two materials is prevented and in which an additional step is not necessary.

SUMMARY OF THE INVENTION

The above and other objects of the present invention are attained by a ceramic multi-layer wiring board comprising one or more ceramic layers including one or more interconnected inner conductors arranged in or on the ceramic layers, the inner conductors being made of a non-copper conductor having a melting point higher than a temperature at which the ceramic layers are fired; a top ceramic layer formed on the outermost layer of the ceramic layers, the top ceramic layer having a hole; a copper-based surface wiring layer formed on the top ceramic layer; and a hole-filling conductor filled in the hole in the top ceramic layer and electrically connecting the surface wiring conductor and the inner conducotrs; wherein the hole-filling conductor is made of a metal which is different from the materials of the surface wiring layer and the inner conductors and which does not form eutectic crystals with the material of the surface wiring layer at a temperature at which the surface wiring layer is fired.

Preferably, the surface wiring layer is made of copper, the inner conductors are made of silver and the hole-filling conductor is made of a silver-palladium alloy (Ag-Pd).

Particularly, the present invention provides a ceramic multi-layer wiring board comprising one or more ceramic layers including one or more interconnected inner conductors of silver arranged in or on the ceramic layers; a top ceramic layer formed on the outermost layer of the ceramic layers, the top ceramic layer having a hole; a surface wiring layer of copper formed on the top ceramic layer; and a hole-filling conductor filled in the hole in the top ceramic layer and electrically connecting the surface wiring conductor and the inner conducotrs, the hole-filling conductor being a silver-palladium alloy having a content of palladium in such a high amount to raise the temperature at which the alloy forms eutectic crystals with copper to be higher than the temperature at which the copper surface wiring layer is to be fired.

It is known that silver and copper forms eutectic crystals between them at 760° C. and a copper layer is formed by firing at about 800° to 900° C. Accordingly, during the firing of a copper layer, a hole-filling layer of silver forms eutectic crystals at the interface thereof with the copper wiring layer, which should be avoided. In the present invention, this is attained by alloying the silver with palladium. Silver has the melting point of 960° C. and palladium has the melting point of 1554° C., and the temperature at which the silver-palladium alloy forms eutectic crystals with copper is raised with an amount of palladium in the alloy. Accordingly, the amount of palladium in the alloy is selected such that the alloy does not form eutectic crystals with copper at the temperature at which the copper is fired.

In present invention, the copper-based surface wiring layer comprises not less than 90% by weight of copper and the non-copper-based conductor may be Ag, Ag-Pt, Ag-Pd, Ag-Pt-Pd, Ag-Au, etc. When Ag-Pd or the like is selected for the material of the non-copper-based conductor, the amount of palladium, etc. should be sufficiently low, for example, 5 to 25% by weight for Pd, since the electric resistance of Pd, etc. is high in comparison with that of silver.

The hole-filling conductor may be a single metal or an alloy or an intermetallic compound. Examples of the hole-filling conductor include Ag-Pt, Ag-Pd, Ag-Au, Ag-Pt-Pd, etc. The hole-filling conductor may be an alloy composed of the same metals as those composing the inner conductor, as far as the composition of the alloy is different between them. If the inner conductor is a silver alloy and the hole-filling conductor is also a silver alloy, the silver content of the hole-filling conductor is lower than that of the inner conductor.

In a preferred embodiment, the hole-filling conductor is an alloy of Pd or Pt and a metal which is the same as the main constituent metal of the alloy of the inner conductor, the content of the main constituent metal in the hole-filling conductor being higher in a region of the hole-filling conductor adjacent to the inner conductor than in a region adjacent to the surface wiring layer.

When the inner conductor is silver and the hole-filling conductor is made from a Ag-Pd paste, it is preferable that the Pd content of the hole-filling conductor is not more than 40% by weight in order to ensure the connection between the inner conductor and the hole-filling conductor. If the Pd content is higher than 40% by weight, Ag in the inner conductor selectively diffuses into the Ag/Pd of the hole-filling conductor to form voids in the Ag conductor (Kirkendal effect), thereby lowering the reliability of the connection. In other words, the content of silver is preferably not less than 60% by weight of the alloy. It is also preferred that when the surface wiring layer is formed by firing a Cu paste at about 900° C., the Pd content of a Ag-Pd alloy of the hole-filling conductor is not less than 30% by weight, to avoid the formation of eutectic crystals. If the copper layer is fired at a temperature lower than 900° C., of source, the content of Pd may be lower than 30% by weight. From the similar considerations, the content of 60 to 70% by weight of silver is generally preferred. For example, in Ag-Pt, Ag-Pt-Pd or other silver alloys, the other-than-Ag constituent metals such as Pt, or Pt and Pd (total), or the like may be considered as being equivalent to Pd in Ag-Pd.

It should be however noted that when the hole-filling conductor has a gradation of the concentration of silver, the content of the silver at a region adjacent to the copper layer should preferably be less than 30% by weight (the content of Pd or the like should preferably be 30% by weight or more to prevent eutectic crystals), but the content of silver in the alloy of the hole-filling conductor at a region remote from the copper layer, for example, at a region adjacent to the inner conductor, may contain more silver, up to 100% by weight.

In the present invention, the surface wiring layer of a copper-based material and the inner conductor of a non-copper-based material having an excellent electrical conductivity and a melting point higher than the temperature at which the multi-layer substrate is fired are electrically connected through the hole-filling conductor. The hole-filling conductor can provide an excellent bonding and an excellent electrical connection with the inner conductor at a temperature at which the substrate is fired. The hole-filling conductor does not form eutectic crystals with the materials of the surface wiring layer and the inner conductor so that the surface wiring layer has an excellent resistance to migration and an excellent resistance to solder leach. When a Ag-Pd alloy is used together with Cu as the surface wiring layer and Ag as the inner conductor, the hole-filling conductor of a Ag-Pd alloy is excellent in resistance to migration and resistance to solder leach, irrespective of formation of eutectic crystals. The use of this type hole-filling conductor does not require an additional step to prevent formation of eutectic crystals and allows a high productivity.

EXAMPLES

Example 1

Figure 1:
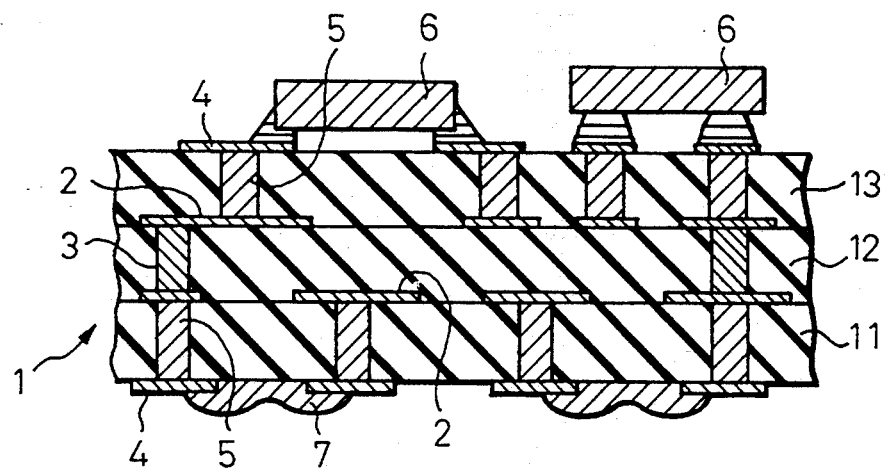
FIGS. 1 to 4 are cross-sectional views of ceramic multi-layer wiring boards in Examples of the present invention.

FIG. 1 is referred to. The ceramic multi-layer wiring board in FIG. 1 is formed from three green ceramic sheets and comprises a lower layer 11, a middle layer 12 and an upper layer 13 made of ceramic insulating layers. The middle layer 12 has through-holes (100 μm diameter) in which an Ag conductor 3 is filled and has inner wiring layers 2 of Ag (10 μm thick) on the both surfaces of the layer 12 formed by a printing method. The lower and upper layers 11 and 13 have through-holes (100 μm diameter) in which a hole-filling conductor 5 of Ag-Pd is filled and have surface wiring layers 4 of Cu formed by a printing method.

On the surface of the lower layer 11 is provided a thick film resistance 7 by a printing method, and on the surface of the upper layer 13 is provided circuit parts 6 by soldering.

The fabricating procedure for this ceramic wiring board is described below.

Glass powders used were prepared by melting, quenching in water and pulverizing a mixture of CaO, PbO, $Al_2O_3$, $SiO_2$ and $B_2O_3$ with a certain composition to an average particle size of 2 to 5 μm. To a mixture of 60% by weight of the thus prepared glass powder and 40% by weight of $Al_2O_3$ powder with an average particle size of 2 to 5 μm, a solvent such as terpineol and a binder such as ethylcellose were added and kneaded to form a ceramic slurry. Green sheets for the lower, middle and upper layers were prepared from this ceramic slurry.

The green sheets were punched to form through-holes with a diameter of about 0.3 mm at predetermined positions.

An Ag paste was prepared by mixing and kneading an Ag powder with ethylcellose as a binder and terpineol as a solvent and printed and filled as the inner conductors (through-hole filling conductors) 3 in the through-holes of the green sheet for the middle layer 12. The same Ag paste was printed on the both surfaces of the green sheet for the middle layer 12, to form inner wiring conductor lines 2.

An Ag-Pd paste was prepared by mixing and kneading an Ag-Pd alloy powder (35% by weight Ag) with ethylcellose as a binder and terpineol as a solvent and printed and filled as the hole-filling conductors 5 in the through-holes of the green sheets for the lower and upper layers 11 and 13.

The three green sheets were then stacked with each other and pressed and bonded at 100° C. to form a laminated green sheet. The laminated green sheet was fired in air at 800° to 1000° C. for 25 minutes.

The Cu paste was then printed on the surfaces of the fired substrate to form wiring patterns for surface wiring layers 4. The substrate was then fired in an $N_2$ atmosphere at 850° to 1000° C. for 10 minutes.

A mixed powder of RuO powder, the above glass powder and alumina powder with a predetermined composition was mixed and kneaded with the binder and solvent as above, to form an RuO paste. The $RuO_2$ paste was printed on the surface of lower layer 11 and a ceramic paste was overcoated on the $RuO_2$ paste layer, which was fired to form a thick film resistor 7. Circuit parts 6 were also soldered on the surface of the upper layer 13. Thus, the ceramic wiring board (circuit board) was completed.

The cross-section of the ceramic wiring board was observed after cutting and no eutectic crystals were found at the interface between the hole-filling conductors 5 and the surface wiring layers 4.

Example 2

Figure 2:
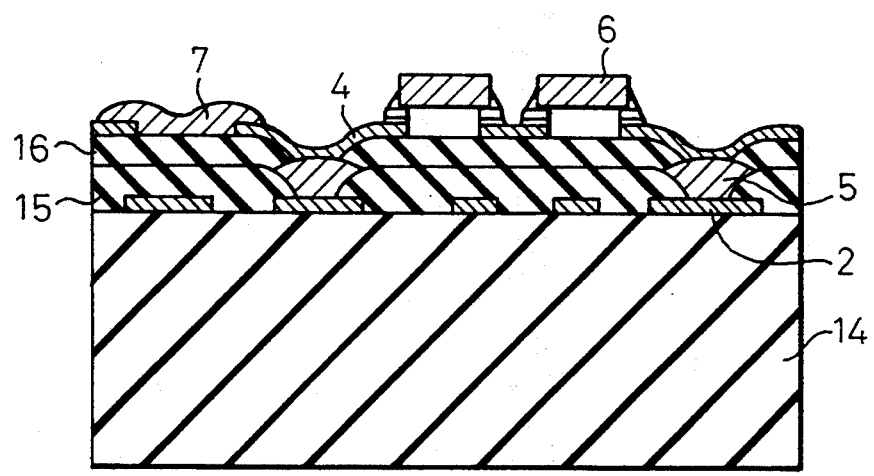

FIG. 2 is referred to. The ceramic multi-layer wiring board comprises three printed insulating layers. On a substrate 14, printing and firing are repeated to form a middle layer 15 and an upper layer 16 of ceramic insulating layers. An inner wiring layer 2 of Ag is formed on the surface of the substrate 14, hole-filling conductors 5 of Ag-Pd are filled in the holes of the middle layer 15, and a surface wiring layer 4 of Cu is disposed on the surface of the upper layer 16. A thick film resistor 7 is formed on the upper layer 16 by printing and firing and circuit parts 6 are soldered on the surface of the upper layer 16.

The fabrication of the above ceramic multi-layer wiring board is described below.

The substrate 14 was an alumina substrate fired at about 1600° C. An Ag paste as used in Example 1 was printed and fired in air at 800° to 950° C. for 10 minutes to form an inner wiring conductor 2.

The ceramic slurry as used in Example 1 was printed on the substrate 14 and the inner wiring conductor 2 and fired in air at 800° to 950° C. for 10 minutes, to form a middle layer 15. The Ag-Pd paste as used in Example 1 was printed to fill holes in the middle layer 15 and fired in air at 800 to 950° C. for 10 minutes to form a hole-filling conductor 5.

The ceramic slurry as used in Example 1 was printed on the middle layer 15 and fired in air at 800 to 950° C. for 10 minutes, to form an upper layer 16. The Cu paste as used in Example 1 was printed on the upper layer 15 and fired in $N_2$ at 850° to 950° C. for 10 minutes to form a surface wiring layer 4.

The remaining steps were the same as in Example 1.

The ceramic wiring board was evaluated and no eutectic crystals were found at the interface between the hole-filling conductors 5 and the surface wiring layers 4.

Example 3

Figure 3:
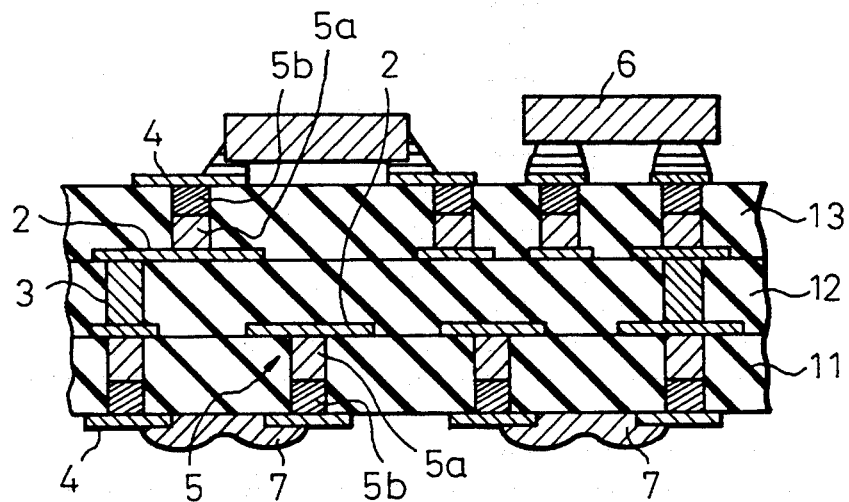

FIG. 3 is referred to. This Example was similar to Example 1, except that in the through-holes of the lower and upper layers 11 and 13, a first Ag-Pd alloy 5a having a relatively low Pd content was filled in a region of the through-holes adjacent to the middle layer 12 and a second Ag-Pd 5b alloy having a relatively high pd content was filled in a region of the through-holes adjacent to the lower and upper layers 11 and 13. The first Ag-Pd paste had a Pd content of 10% by weight and the second Ag-Pd paste had a Pd content of 40% by weight.

In this construction, the Pd content is made lower at the interface of the hole-filling conductor 5 with the inner wiring conductors 2, by which Kirkendal voids due to selective diffusion of Ag is effectively prevented and the adhesion of the hole-filling conductors 5 to the inner wiring conductors 2 is improved.

It is possible to increase the number of the printings so that the pd content in the hole-filling conductors 5 is varied in two or more steps.

Example 4

Figure 4:
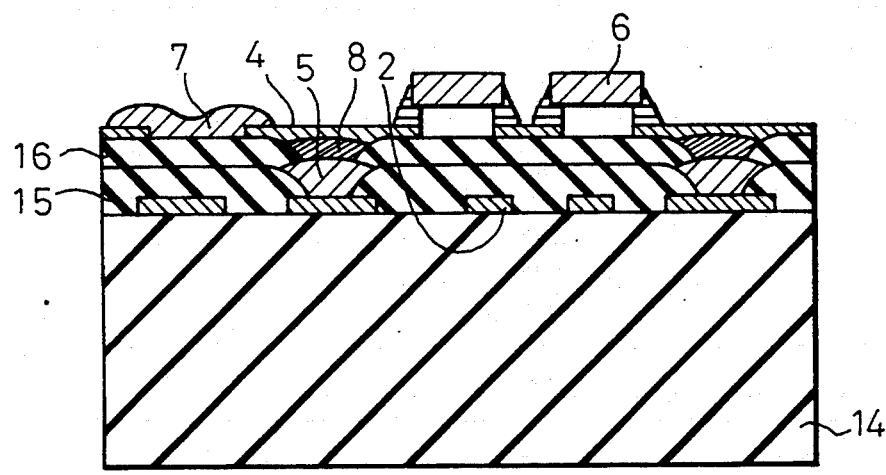

FIG. 4 is referred to. This Example was similar to Example 2, except that after firing of the upper layer 16, a second hole-filling conductor 8 having a Pd content higher than that of the hole-filling conductor 5 was printed and fired, followed by printing and firing the surface wiring layer 4. The second hole-filling conductor 8 was made under the same conditions as those for the hole-filling conductor 5 except for the composition. Kirkendal voids can be effectively prevented in the same way as in Example 3.

Example 5

FIG. 1 is referred to. This Example was similar to Example 1, except that the inner conductors comprising the inner wiring conductors 2 and through hole-filling conductors 3 were made of W (tungsten) and the hole-filling conductor 5 was made of a W-Pt alloy. A paste for the inner conductors of W and a paste for the hole-filling conductor 5 of W-Pt were prepared in a similar procedure as that for the pastes of Ag and Ag-Pd.

This Example allows relatively high firing temperatures for the hole-filling conductor, the inner conductor, the lower layer, the middle layer and the upper layer, so that a dense ceramic multi-layer substrate can be obtained.

Also, it should be noted that W and Cu are not interdiffused with each other. The insertion of a W-Pt alloy between Cu and W allows interdiffusion between Cu and W-Pt and between W and W-Pt, so that the bonding strength between the conductors can be made higher and a dense substrate can be obtained.

Similar effects can be obtained by W-Co, W-Cr, W-Fe, W-Mn, W-Ni, W-Ir or the like. The inner conductor can be Mo for W.

Although the surface wiring layer is of copper, the inner conductor is of silver and the hole-filling conductor is of Ag-Pd in the above Examples, similar effects were obtained by replacing the copper to a copper alloy for the surface wiring layer, the Ag-Pd to Ag-Pt, Ag-Pd, Ag-Pt-Pd, Ag-Au, etc. for the inner conductor, and the Ag-Pd to Ag-Au, Ag-Pt-Pd, etc. for the hole-filling conductor. However, when a silver alloy such as Ag-Pd is used for the inner conductor, the content of Pd is disrably in a range of 5 to 25% by weight to lower the wiring resistance.

What are claimed are:

1. A ceramic multi-layer wiring board comprising:
   at least one ceramic layer including at least one inner conductor arranged in or on said at least one ceramic layer, said at least one inner conductor being made of a silver-based material having a melting point higher than a first temperature at which said at least one ceramic layer is fired;
   a top ceramic layer formed on a first outermost layer of said at least one ceramic layer, said top ceramic layer having a hole;
   a surface wiring conductor of a copper-based material formed on said top ceramic layer; and
   a hole-filling conductor filled in said hole in said top ceramic layer and electrically connecting said surface wiring conductor and said at least one inner conductor, said hole-filling conductor [is]being made of a silver alloy which does not form eutectic crystals with said copper-based material of said surface wiring conductor at a second temperature at which said surface wiring conductor is fired.

2. A ceramic multi-layer wiring board according to claim 1, wherein said copper-based material of said surface wiring conductor is copper, said silver-based material of said at least one inner conductor is silver and said silver alloy of said hole-filling conductor is an Ag-Pd alloy.

3. A ceramic multi-layer wiring board comprising:

at least one ceramic layer including at least one inner conductor of silver arranged in or on said at least one ceramic layer;

a top ceramic layer formed on an outermost layer of said at least one ceramic layer, said top ceramic layer having a hole;

a surface wiring conductor of copper formed on said top ceramic layer; and a hole-filling conductor filled in said hole in said top ceramic layer and electrically connecting said surface wiring conductor and said at least one inner conductors, said hole-filling conductor being made of a silver-palladium alloy.

4. A ceramic multi-layer wiring board according to claim 1, wherein said copper-based material of said surface wiring conductor comprises not less than 90% by weight of copper and said silver based material of said at least one inner conductor is one of Ag, Ag-Pt, Ag-Pd, Ag-Pt-Pd and Ag-Au.

5. A ceramic multi-layer wiring board according to claim 1, wherein said silver alloy of said hole-filling conductor is one of Ag-Pt, Ag-Pd, Ag-Au and Ag-Pt-Pd.

6. A ceramic multi-layer wiring board according to claim 1, wherein said silver alloy of said hole-filling conductor is an alloy of one of Pd and Pt with a metal composing one of said surface wiring conductor and said at least one inner conductor, a first percent content of said metal in said hole-filling conductor being larger in a first region of said hole-filling conductor adjacent to said at least one inner conductor than a second percent content of said metal in said hole-filling conductor in a second region adjacent to said surface wiring conductor.

7. A ceramic multi-layer wiring board according to claim 3, wherein a first percent content of Ag in said silver-palladium alloy of said hole-filling conductor is larger in a first region of said hole-filling conductor adjacent to said at least one inner conductor than a second percent content of Ag in said silver-palladium alloy of said hole-filling conductor in a second region adjacent to said surface wiring conductor.

8. A ceramic multi-layer wiring board according to claim 1, wherein said surface wiring conductor is formed of a copper-based material fired at a temperature of at least 850° C.

9. A ceramic multi-layer wiring board according to claim 1, further comprising:

a bottom ceramic layer formed on a second outermost layer of said at least one ceramic layer, said bottom ceramic layer having holes;

said at least one ceramic layer having holes in which said silver-based material is filled; and said holes of said top ceramic layer and said holes of said bottom ceramic layer are filled with said silver alloy.

10. A ceramic multi-layer wiring board comprising:

at least one laminated ceramic layer each having a through hole and each-including at least one inner conductor arranged in said through holes and on said at least one laminated ceramic layer, said at least one inner conductor being made of a silver-based material having a melting point higher than a temperature at which said at least one laminated ceramic layer is fired;

top and bottom ceramic layers formed on opposite outermost layers of said at least one ceramic layer, said top and bottom ceramic layers each having through holes in which a silver alloy is filled; and a surface wiring conductor made of a copper-based material formed on at least one of said top ceramic layer and said bottom ceramic layer, said silver alloy electrically connecting said surface wiring conductor to said at least one inner conductor;

wherein said silver alloy does not form eutectic crystals with said copper-based material at a temperature at which said surface wiring conductor is fired.

11. A ceramic multi-layer wiring board comprising:

at least one laminated ceramic layer including at least one inner conductor arranged in or on said at least one-laminated layer, said at least one inner connector being made of a silver-based material having a melting point higher than a temperature at which said at least one laminated layer is fired;

a top ceramic layer formed on an outermost layer of said at least one laminated ceramic layer, said top ceramic layer having a hole;

a surface wiring conductor of a copper-based material formed on said top ceramic layer;

a hole-filling conductor filled in said hole of said top ceramic layer, said hole-filling conductor comprising:

a first region adjacent to said at least one ceramic layer; and a second region adjacent to said surface wiring conductor, said first region and said second region of said hole-filling conductor being made of an alloy of one of Pd and Pt with silver, a first content of a respective one of Pd and Pt in said first region is lower than a second content of said respective one of Pd and Pt in said second region.

12. A ceramic multi-layer wiring board according to claim 11, wherein:

said content of said respective one of Pd and Pt in said first region is not less than 30%; and said content of said respective one of Pd and Pt in said second region is not more than 40%.

* * * * *